United States Patent [19]

Tanaka

[11] Patent Number: 4,807,250
[45] Date of Patent: Feb. 21, 1989

[54] CODING DEVICE SELECTIVELY CONNECTED TO A TRANSMISSION LINE

[75] Inventor: Susumu Tanaka, Tokyo, Japan
[73] Assignee: NEC Corporation, Tokyo, Japan
[21] Appl. No.: 915,351
[22] Filed: Oct. 6, 1986

[30] Foreign Application Priority Data

Oct. 4, 1985 [JP] Japan .................................. 60-219995

[51] Int. Cl.$^4$ ............................................ H04B 14/06
[52] U.S. Cl. ......................................... 375/28; 375/34; 332/11 D
[58] Field of Search ......................... 375/25, 26, 28, 34; 455/31; 340/347 AD; 332/11 D; 370/110.1, 110.4, 111; 381/41, 46

[56] References Cited

U.S. PATENT DOCUMENTS

| | | | |
|---|---|---|---|
| 2,669,608 | 2/1954 | Goodall | 375/34 |
| 3,231,674 | 1/1966 | Boyer et al. | 375/34 |
| 3,516,022 | 2/1970 | Brolin | 332/11 D |
| 3,699,446 | 10/1972 | Sainte-Beuve | 375/26 |
| 4,167,653 | 9/1979 | Araseki et al. | 381/46 |
| 4,541,101 | 9/1985 | Potage et al. | 375/28 |

OTHER PUBLICATIONS

IEEE Transactions on Communications, vol. Com-29, No. 3, Mar. 1981, pp. 337–345; "Design and Performance of a DSI Terminal for Domestic Applications".

*Primary Examiner*—Benedict V. Safourek
*Attorney, Agent, or Firm*—Sughrue, Mion, Zinn, Macpeak, and Seas

[57] ABSTRACT

In a predictive coding device which is for coding an input signal into a coded signal, such as a PCM signal, and for use in combination with a transmission line having an on and an off state wherein the coding device is selectively connected to the transmission line and disconnected therefrom, a code converter (16) operatively coupling the transmission line to produce a mute signal of a predetermined code as a first local output signal and the coded signal as a second local output signal when the transmission line is in the off and the on states, respectively. A local decoder (15) locally decodes either the first or the second local output signal into a local decoded signal for use in coding the input signal into the coded signal. Preferably, the predetermined code is a code which the coded signal has when the input signal carries no information. Usually, the coding device is selectively connected to the transmission line and disconnected therefrom through a digital speech interpolation (DSI) device.

2 Claims, 3 Drawing Sheets

CODING DEVICE SELECTIVELY CONNECTED TO A TRANSMISSION LINE

BACKGROUND OF THE INVENTION

This invention relates to a coding device for use in a digital communication system and, more particularly, to a predictive coding device to which a transmission line is effectively available.

In digital communication systems, analogue signals are coded into digital signals by waveform coding such as pulse code modulation (PCM). Another type of waveform coding is predictive coding, for example, differential PCM (DPCM), adaptive DPCM (ADPCM), and so on. The ADPCM is disclosed in CCITT Recommendation G.721 of the title of "32 kbit/s Adaptive Differential Pulse Code Modulation (ADPCM)."

Such a predictive coding system includes a coding device in a transmitting station. The coding device codes an input signal into a coded signal which should be transmitted to the transmission line. The coding device comprises a subtractor for subtracting a local decoded signal from the input signal to produce a difference signal. The difference signal is coded into the coded signal by a quantizer. The quantizer may be an adaptive quantizer. The coded signal is locally decoded into the local decoded signal by a local decoder. The predictive coding system further includes a decoding device in a receiving station. The decoding device has a structure which is identical to the local decoder of the coding device and produces a decoded signal in response to the coded signal received from the coding device through the transmission line.

In the predictive coding system described above, the decoding device obtains a current element of the decoded signal from not only a current element of the coded signal but also a series of previous elements of the coded signals which have been received before the current element of the coded signal. Therefore, the decoding device must always continuously receive the series of previous elements which are identical with signal elements of the coded signal used in the local decoder of the coding device. Otherwise, operation of the decoding device will be different from that of the local decoder, which makes correct reproduction difficult in the decoding device.

By the way, a digital communication system is known such that the coding device is selectively connected to the transmission line. More particularly, the coding device is connected selectively to the transmission line for a predetermined number of channels and is disconnected therefrom for one or more channels in excess of the predetermined number. Such selective connection may be carried out, for example, by use of a digital speech interpolation (DSI) technique which will later be described later in more detail. In such a digital communication system, the decoding device receives a series of coded signal elements which are different from the signal elements used in the local decoder of the coding device when the coding device is disconnected from the transmission line.

SUMMARY OF THE INVENTION

It is therefore an object of this invention to provide a coding device for use in a digital communication system wherein the coding device is selectively connected to a transmission line.

Other objects of this invention will become clear as the description proceeds.

A coding device to which this invention is applicable, codes an input signal into a coded signal for transmission to a transmission line and comprises subtracting means for subtracting a local decoded signal from the input signal to produce a difference signal, coding means for coding the difference signal into the coded signal, and local decoding means for locally decoding an internal code signal related to the coded signal into the local decoded signal. According to this invention, the coding device comprises producing means between the coding means and the local decoding means and for operative coupling to the transmission line to be responsive to the coded signal for producing a first local output signal of a predetermined code and a second local output signal identical with the coded signal when the transmission line is put in an off state and an on state, respectively, and means for supplying the first and the second local output signals to the local decoding means as the internal code signal.

DESCRIPTION OF THE PREFERRED EMBODIMENT

Figure 1:
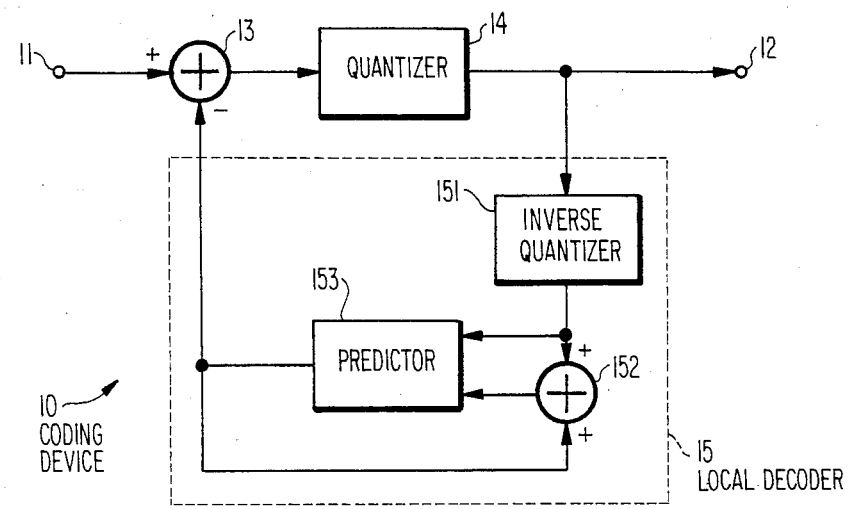
FIG. 1 is a block diagram of a conventional coding device.

Referring to FIG. 1, a conventional coding device 10 will be described at first in order to facilitate an understanding of the present invention. The coding device 10 receives a coder input signal from a coder input terminal 11 and transmits a coded signal from a coder output terminal 12 for transmission to a decoding device through a transmission line. The decoding device and the transmission line will be later with reference to different figures of the accompanying drawings. The coder input signal is, for example, a PCM input signal of 64 kbit/s and will be called a PCM input signal in the following. In this event, the coded signal is a PCM output signal of 32 kbit/s and will hereafter be referred to as the PCM output signal. The coding device 10 encodes the PCM input signal into the PCM output signal. Each code of the PCM input signal is eight binary digits, while each code of the PCM output signal is four binary digits.

The coding device 10 comprises a subtractor 13. The subtractor 13 subtracts an estimate of the PCM input signal from the PCM input signal to produce a difference signal. Responsive to the difference signal, a quantizer 14 acts as a coding arrangement for coding the difference signal into the PCM output signal. Namely, the difference signal is a succession of codes, each assigned to the four binary digits by the quantizer 14.

Responsive to the PCM output signal, a local decoder 15 locally decodes the PCM output signal into a local decoded signal, which is delivered to the subtractor 13 as the estimate of the input signal.

The local decoder 15 comprises an inverse quantizer 151 for producing a quantized difference signal in response to the PCM output signal. An adder 152 adds the local decoded signal to the quantized difference signal to produce a reproduction of the PCM input signal. Both the reproduction and the quantized difference signal are sent to a predictor 153 which produces the local decoded signal. In this manner, the local decoder 15 serves as a feedback loop.

The conventional coding device 10 is operable as a DPCM encoder. The coding device 10 is easily modified to an ADPCM encoder when the quantizer 14, the inverse quantizer 151 and the predictor 153 are of the adaptive type known in the art.

Figure 2:
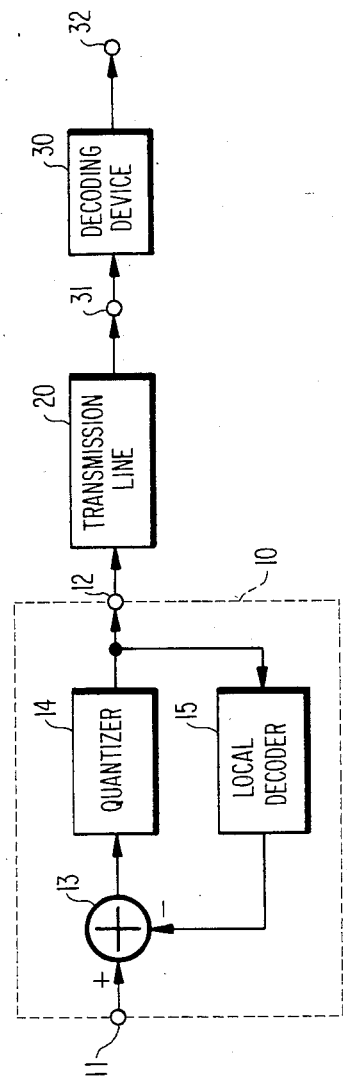
FIG. 2 is a block diagram of a digital communication system to which the conventional coding device shown in FIG. 1 is applied.

Referring to FIG. 2, a digital communication system includes the conventional coding device 10 illustrated with reference to FIG. 1 in a transmitting station. The coder output terminal 12 is connected to a coder end of the transmission line depicted at 20. A decoder end of the transmission line 20 is connected to a decoder input terminal 31 of the decoding device of a receiving station. The decoding device is designated by a reference numeral 30.

The decoding device 30 has a structure which is identical with the local decoder 15 of the coding device 10. The decoding device 30 produces a decoded signal in response to the PCM output signal received from the coding device 10 through the transmission line 20. The decoded signal is approximately identical with the PCM input signal applied to the coder input terminal 11 of the coding device 10 and is delivered from a decoder output terminal 32 of the decoding device 30 as a decoding output signal.

Figure 3:
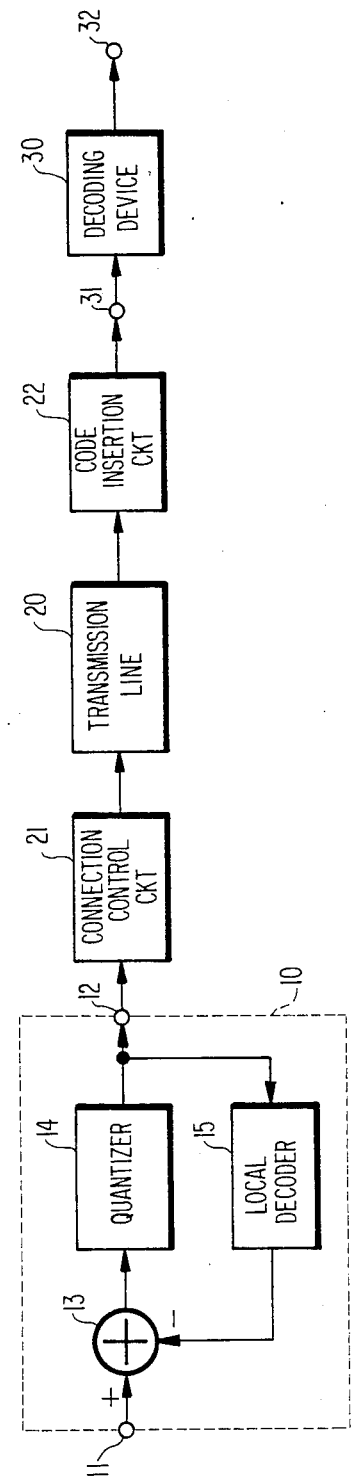
FIG. 3 is a block diagram of another digital communication system in which the conventional coding device shown in FIG. 1 is selectively connected to a transmission line.

Referring to FIG. 3, another digital communication system includes the conventional coding device 10 illustrated with reference to FIG. 1. Similar parts are designated by like reference numerals In the digital communication system being illustrated, the conventional coding device 10 is selectively connected to the transmission line 20.

The illustrated digital communication system comprises a connection control circuit 21 between the coder output terminal 12 and the coder end of the transmission line 20. By the connection control circuit 21, the coding device 10 is selectively connected to the transmission line 20 and disconnected therefrom. When the coding device 10 is connected to the transmission line 20, the transmission line 20 is herein said to be put in an on state. The transmission line 20 is said to be put in an off state when the coding device 10 is disconnected from the transmission line 20.

Between the decoder end of the transmission line 20 and the decoder input terminal 31, inserted is a code insertion circuit 22. When the transmission line 20 is Put in the on state, the PCM output signal is delivered from the coding device 10 through the transmission line 20 to pass through the code insertion circuit 22. On the other hand, the code insertion circuit 22 produces a mute code signal when the transmission line 20 is put in the off state. The mute code signal is a specific coded signal into which the quantizer 14 codes the PCM input signal when the input signal carries no information.

A device which includes the connection control circuit 21 and the code insertion circuit 22 is known as, for example, a DSI (digital speech interpolation) device. The DSI device is for use in a time division multiplex system and can transmit an audio signal at a high transmission efficiency. A large number of coding devices, for example, 200 coding devices are connected to the DSI device (the connection circuit 21) for the transmitting station while 200 decoding devices are connected to the DSI device (the code insertion circuit 22) for the receiving station. An audio PCM input signal, as herein called, is a digital signal into which the audio signal is coded by PCM. Each coding device codes the audio PCM input signal into an audio PCM output signal. The DSI device produces the audio PCM output signals of the 200 coding devices to the 200 decoding devices through the transmission line 20 which has a transmission capacity of a predetermined number of channels, for example, 100 channels.

More specifically, the DSI device of the transmitting station always checks whether each audio PCM output signal is in an active state or in an inactive state, such as pause. The DSI device assigns the channels of the transmission line 20 to the coding devices which produce the audio PCM output signals of the active state. When the predetermined number of channels is exceeded by the number of the coding devices wherein the audio PCM output signals are in the active state, one or more coding devices in excess of the predetermined number are disconnected from the transmission line 20. This will be described later in more in detail. Those of the 200 coding devices will be called assigned coding devices which are assigned with the channels. The DSI device of the transmitting station transmits an assignment signal. The assignment signal indicates correspondence between the assigned coding devices and the channels. The transmission line 20 is put in the on state and in the off state with regard to the assigned coding devices and other coding devices, respectively.

On the other hand, the DSI device of the receiving station distributes the audio PCM output signals received from the assigned coding devices through the channels of the transmission line 20 to the decoding devices which correspond to the assigned coding devices under control of the assignment signal, respectively. The DSI device of the receiving station produces mute code signals to the remainder of the decoding devices to which the audio PCM output signals are not distributed.

If the number of the coding devices, wherein the PCM output signals are in the active state, exceeds the predetermined number of channels, one or more coding devices are disconnected from the transmission line 20 and will be called excluded coding devices in the following. Such a state will hereafter be referred to as an exclusion state. Although the excluded coding devices produce the audio PCM output signals of the active state, the decoding devices corresponding to the excluded coding devices receive the mute code signals If signals transmitted through the DSI device are nonpredictive PCM signals, such as the PCM input signals of the coding devices, communication returns to a normal condition as soon as the exclusion state comes to an end. However, if signals transmitted through the DSI device are predictive coded signals, such as the PCM output signals of the coding devices, operation of local decoders of the excluded coding devices is different during the exclusion state from operation of those of the decoding devices which correspond to the excluded coding devices. Therefore, communication does not return to the normal condition for a long time, even when the exclusion state comes to an end. As a result, communication of the existence of the abnormal condition continues.

Although the coding devices, which produce the audio PCM output signals of the inactive state, are disconnected from the transmission line 20, the audio PCM output signals are not always identical with the mute code signal because audio PCM input signals of a low level, such as of background noise, are supplied to the coding devices For this reason, it is impossible to avoid that the decoding operation is subjected to troubles even if the coding devices are again connected to the transmission line 20.

Figure 4:
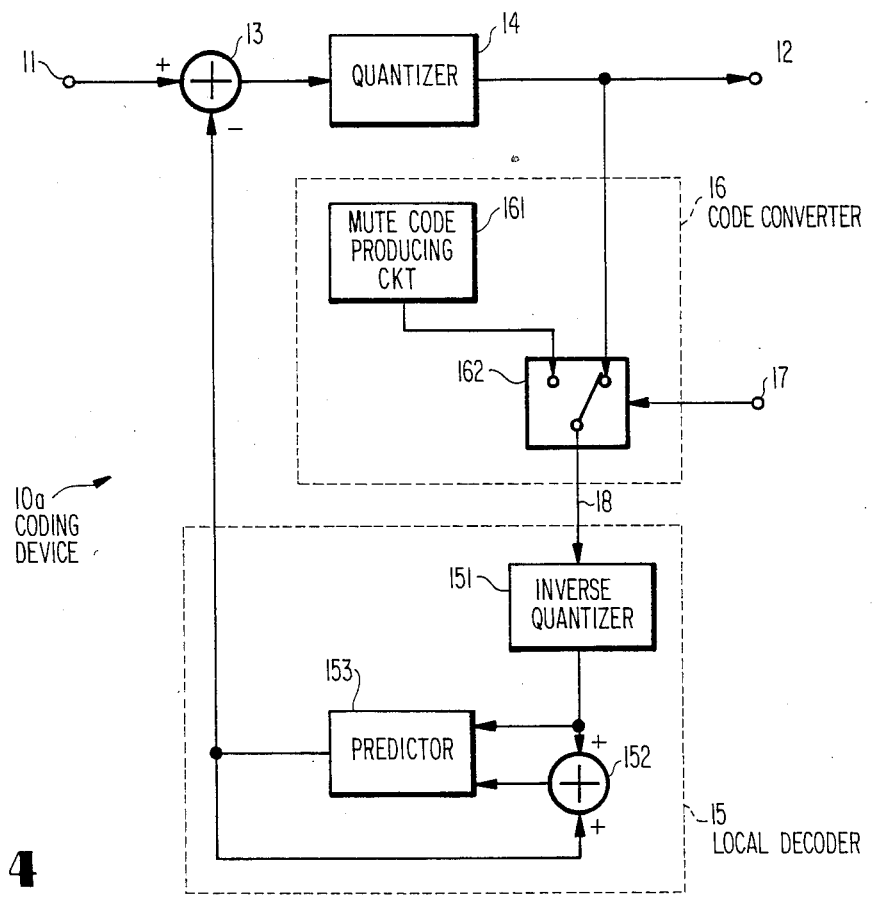
FIG. 4 is a block diagram of a coding device according to an embodiment of the present invention.

Referring to FIG. 4, a coding device 10a according to an embodiment of this invention is similar to that illustrated with reference to FIG. 1 except that a code converter 16 is inserted between the quantizer 14 and the local decoder 15. The code converter 16 serves as a producing arrangement which is operatively coupled to the transmission line 20 (FIG. 2 or 3) and which is responsive to the PCM output signal for producing a first local output signal of a predetermined code and a second local output signal identical with the PCM output signal when the transmission line is put in the off state and the on state, respectively. The code converter 16 comprises a mute code producing circuit 161 for producing the mute code signal of the predetermined code as the first local output signal when the transmission line is put in the off state.

The coding device 10a further receives a control signal from a control input terminal 17, which will later be described. The control signal indicates binary "1" and "0" when the transmission line is put in the off state and the on state, respectively. Responsive to the control signal, a switch circuit 162 selects the first local output signal (the mute code signal) and the second local output signal (the PCM output signal) as a selected one when the control signal indicates binary "1" and "0", respectively. The local decoder 15 locally decodes an internal code signal instead of the PCM output signal. The selected local output signal thus is supplied to the local decoder 15 via a line 18 as the internal code signal.

Figure 5:
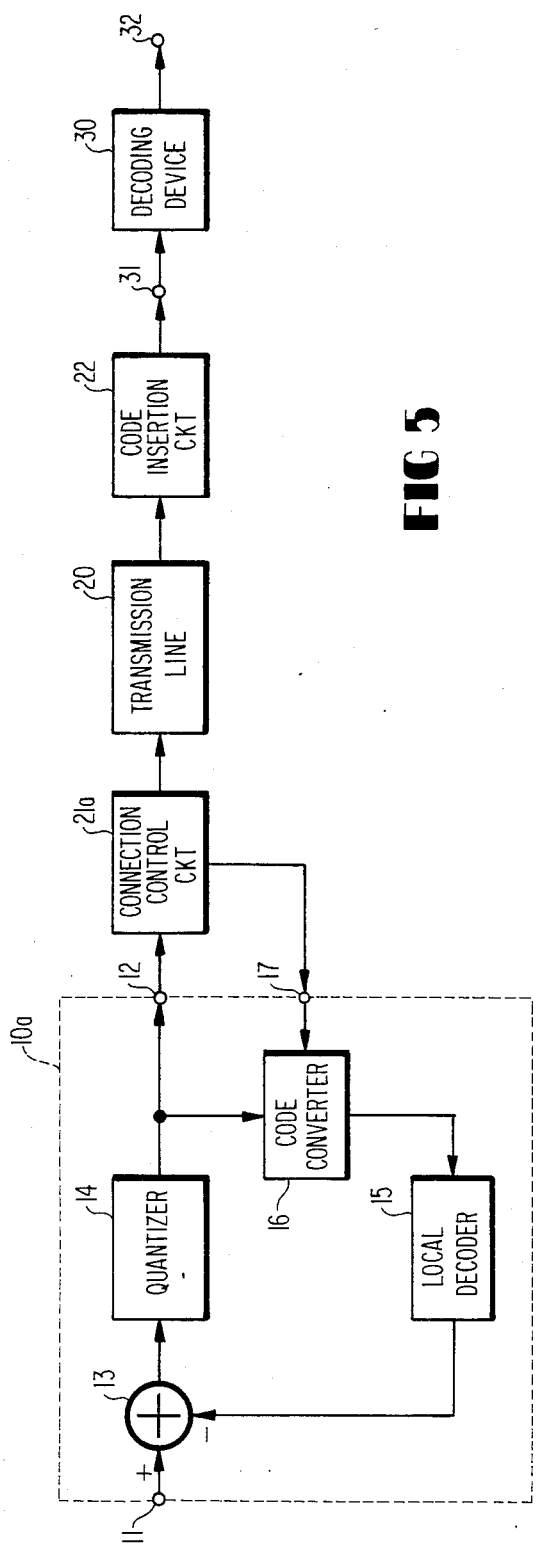
FIG. 5 is a block diagram of a digital communication system wherein the coding device shown in FIG. 4 is selectively connected to a transmission line.

Referring to FIG. 5, a digital communication system includes the coding device 10a in the transmitting station and is similar to that illustrated with reference to FIG. 3 except that the connection control circuit is improved in FIG. 5 into an improved connection control circuit 21a for producing the control signal as will later become clear.

The connection control circuit 21a produces the control signal indicative of the binary "0" and "1" when the coding device 10a is selectively connected to the transmission line 20 and disconnected therefrom, respectively. The control signal is supplied to the control input terminal 17 of the coding device 10a.

Operation of the digital communication system of FIG. 5 now will be described in greater detail.

It will be assumed that the transmission line 20 is put in the off state. In this event, the coding device 10a is disconnected from the transmission line 20 by the connection control circuit 21a. At the same time, the connection control circuit 21a produces the control signal indicative of binary "1" so that the code converter 16 may deliver the mute code signal to the local decoder 15.

On the other hand, the code insertion circuit 22 of the receiving station receives an information signal which indicates that the coding device 10a is disconnected from the transmission line 20. The information signal is, for example, the assignment signal. The code insertion circuit 22 supplies the mute code signal to the decoding device 30 in response to the information signal.

Therefore, the decoding device 30 always receives a signal identical with a signal used in the local decoder 15 of the coding device 10a no matter how the connection control circuit 21a may operate or not. This is because the code converter 16 produces a mute code signal identical with the mute code signal of the code insertion circuit 22 when the coding device 10a is disconnected from the transmission line 20. Thereby, operation of the local decoder 15 of the coding device 10a always coincides with operation of the decoding device 30.

While the present invention has thus far been described in conjunction with a preferred embodiment thereof, it will readily be possible for those skilled in the art to put this invention into practice in various other manners

What is claimed is:

1. A coding device for coding for coding an input signal into a coded signal which is transmitted through a connection control circuit to a transmission line while said coding device is connected to said transmission line through said connection control circuit, said coding device comprising subtracting means for subtracting a local signal from said input signal to produce a difference signal, coding means for coding said difference signal into said coded signal, and local decoding means for locally decoding an internal code signal related to said coded signal into said local decoded signal, said coding device being selectively connected to said transmission line under control of said connection control circuit, wherein the improvement comprises:

code producing means for producing a predetermined code;

selecting means, coupled to said connection control circuit and responsive to a control signal provided by said connection control circuit, for selecting said coded signal as a selected code signal when said control signal indicates connection of said transmission line to said coding device, and said predetermined code as said selected code signal when said control signal indicates disconnection of said transmission line from said coding device; and means for supplying said selected code signal to said local decoding means as said internal code signal.

2. In a communication system for enabling communication between a coding device and a decoding device through a transmission line by selectively connecting said coding device to said transmission line by a digital speech interpolation technique, said coding device coding an input signal into a coded signal by predictive coding and comprising subtracting means for subtracting a local decoded signal from said input signal to produce a difference signal, coding means for coding said difference signal into said coded signal, and local decoding means for locally decoding an internal code signal related to said coded signal into said local decoded signal, the coding device being selectively connected to said transmission line under control of a connection control circuit, the improvement wherein said coding device comprises:

code producing means for producing a predetermined code;

selecting means, responsive to a control said coded signal as a selected code signal when said control signal indicates connection of said transmission line to said signal when said control signal indicates disconnection of said transmission line from said coding device; and means for supplying said selected code signal to said local decoding means a said internal code signal.

* * * * *

UNITED STATES PATENT AND TRADEMARK OFFICE
CERTIFICATE OF CORRECTION

PATENT NO.   :  4,807,250
DATED        :  February 21, 1989
INVENTOR(S)  :  Susumu TANAKA It is certified that error appears in the above-identified patent and that said Letters Patent is hereby corrected as shown below:

COLUMN 2, LINE 50    After "will be" insert --described--.

COLUMN 6, LINE 30    After "local" insert --decoded--.

COLUMN 8, LINE 4     Delete "a" and insert therefor --as--.

Signed and Sealed this

Third Day of October, 1989

Attest:

DONALD J. QUIGG

Attesting Officer                Commissioner of Patents and Trademarks